United States Patent
Imabayashi et al.

(10) Patent No.: US 12,082,430 B2
(45) Date of Patent: Sep. 3, 2024

(54) LIGHT-EMITTING DEVICE, METHOD FOR MANUFACTURING LIGHT-EMITTING DEVICE, AND APPARATUS FOR MANUFACTURING LIGHT-EMITTING DEVICE

(71) Applicant: SHARP KABUSHIKI KAISHA, Sakai (JP)

(72) Inventors: Hiroki Imabayashi, Sakai (JP); Masayuki Kanehiro, Sakai (JP); Hisayuki Utsumi, Sakai (JP); Shota Okamoto, Sakai (JP); Youhei Nakanishi, Sakai (JP); Tatsuya Ryohwa, Sakai (JP); Kanako Nakata, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 777 days.

(21) Appl. No.: 17/258,336

(22) PCT Filed: Jul. 24, 2018

(86) PCT No.: PCT/JP2018/027721
§ 371 (c)(1),
(2) Date: Jan. 6, 2021

(87) PCT Pub. No.: WO2020/021636
PCT Pub. Date: Jan. 30, 2020

(65) Prior Publication Data
US 2021/0273189 A1    Sep. 2, 2021

(51) Int. Cl.
*H01L 51/50*      (2006.01)
*B82Y 20/00*      (2011.01)
*B82Y 40/00*      (2011.01)
*C09K 11/02*      (2006.01)
*H01L 51/00*      (2006.01)
*H01L 51/56*      (2006.01)
(Continued)

(52) U.S. Cl.
CPC ............ *H10K 50/115* (2023.02); *B82Y 20/00* (2013.01); *B82Y 40/00* (2013.01); *C09K 11/025* (2013.01); *H10K 71/00* (2023.02); *H10K 71/12* (2023.02)

(58) Field of Classification Search
CPC ...... H10K 50/115; C09K 11/025; B82Y 20/00
See application file for complete search history.

(56) References Cited

U.S. PATENT DOCUMENTS 9,035,286 B2 *   5/2015  Chen ..................... H10K 59/38
                                                            438/69
2007/0202333 A1  8/2007  O'Brien et al.
(Continued)

FOREIGN PATENT DOCUMENTS

JP    2007537886 A   12/2007
JP    2009076282 A    4/2009
(Continued)

*Primary Examiner* — Peniel M Gumedzoe
(74) *Attorney, Agent, or Firm* — ScienBiziP, P.C.

(57) ABSTRACT

Provided is a light-emitting device including a light-emitting element including a first electrode, a second electrode, and a quantum dot layer between the first electrode and the second electrode, wherein, in the quantum dot layer, quantum dots each including a core, a shell covering the core, and a ligand coordinated with a surface of the shell and having defect compensation properties are layered.

19 Claims, 8 Drawing Sheets

(51) Int. Cl.
*H10K 50/115* (2023.01)
*H10K 71/00* (2023.01)
*H10K 71/12* (2023.01)

(56) References Cited

U.S. PATENT DOCUMENTS

| | | |
|---|---|---|
| 2008/0160306 A1 | 7/2008 | Mushtaq et al. |
| 2011/0070147 A1 | 3/2011 | O'Brien et al. |
| 2011/0070443 A1 | 3/2011 | O'Brien et al. |
| 2012/0025155 A1 | 2/2012 | O'Brien et al. |
| 2012/0174969 A1* | 7/2012 | Murayama ............. H10K 30/35 |
| | | 257/E51.026 |
| 2013/0069036 A1 | 3/2013 | Miyata |
| 2014/0091257 A1 | 4/2014 | O'Brien et al. |
| 2016/0152892 A1 | 6/2016 | O'Brien et al. |
| 2016/0233449 A1 | 8/2016 | Murayama et al. |
| 2017/0022627 A1 | 1/2017 | O'Brien et al. |
| 2017/0183567 A1* | 6/2017 | Zhou ........................ G03F 7/027 |
| 2017/0271552 A1* | 9/2017 | Kim ..................... H10K 50/115 |
| 2019/0161677 A1 | 5/2019 | O'Brien et al. |

FOREIGN PATENT DOCUMENTS

| | | |
|---|---|---|
| WO | 2011/148791 A1 | 12/2011 |
| WO | 2015/056750 A1 | 4/2015 |

* cited by examiner (a)

(b)

LIGHT-EMITTING DEVICE, METHOD FOR MANUFACTURING LIGHT-EMITTING DEVICE, AND APPARATUS FOR MANUFACTURING LIGHT-EMITTING DEVICE

TECHNICAL FIELD

The disclosure relates to a light-emitting device including a light-emitting element including quantum dots.

BACKGROUND ART

In recent years, quantum dots have been used to configure light-emitting elements, and the development and practical use of light-emitting devices including the light-emitting elements has been achieved. As described in PTL 1 below, a compound semiconductor formed from particles (semiconductor nanoparticles) having a dimension in the order of from 2 to 100 nm is used in the quantum dots used in such a light-emitting device.

CITATION LIST

Patent Literature

PTL 1: JP 2007-537886 T

SUMMARY

Technical Problem

Conventional light-emitting devices such as that described above include a light-emitting element including an anode, a cathode, and a light-emitting layer (quantum dot layer) provided between the anode and the cathode, and the light-emitting device emits light via the quantum dots functioning as luminescent material included in the light-emitting layer. In other words, in such a light-emitting device, when a drive current flows between the anode and the cathode and holes and electrons recombine in the light-emitting layer, light (fluorescence) is emitted in response to the resultant excitons transitioning from the conduction band of the quantum dots to the valence band.

However, in known light-emitting devices such as that described above, there has been a problem in that luminous efficiency decreases due to structural defective portions of the quantum dots. In particular, holes and/or electrons are trapped at defective portions in the quantum dots, causing these holes and/or electrons to deactivate without contributing to light emission, thus reducing luminous efficiency.

In light of the above problems, an object of the disclosure is to provide a light-emitting device capable of preventing a decrease in luminous efficiency due to a defective portion of a quantum dot, a method for manufacturing a light-emitting device, and a manufacturing apparatus for a light-emitting device.

Solution to Problem

To solve the above-described problem, a light-emitting device according to the disclosure is a light-emitting device including a light-emitting element including a first electrode, a second electrode, and a quantum dot layer between the first electrode and the second electrode, wherein, in the quantum dot layer, a plurality of quantum dots each including a core, a shell covering the core, and a ligand coordinated with a surface of the shell and having defect compensation properties are layered.

A method for manufacturing a light-emitting device according to the disclosure is a method for manufacturing a light-emitting device including a light-emitting element including a first electrode, a second electrode, and a quantum dot layer between the first electrode and the second electrode, the method including synthesizing a quantum dot including a core and a shell covering the core with a ligand having defect compensation properties, coordinating the ligand on a surface of the shell of the quantum dot, and forming the quantum dot layer in which a plurality of the quantum dots are layered using a solution in which the plurality of the quantum dots each coordinated with the ligand are dispersed in a solvent.

A manufacturing apparatus for a light-emitting device according to the disclosure is a manufacturing apparatus for a light-emitting device including a light-emitting element including a first electrode, a second electrode, and a quantum dot layer between the first electrode and the second electrode, the apparatus including a synthesis device configured to synthesize a quantum dot including a core and a shell covering the core with a ligand having defect compensation properties, a coordination device configured to coordinate the ligand on a surface of the shell of the quantum dot, and a film formation device configured to form the quantum dot layer in which a plurality of the quantum dots are layered using a solution in which the plurality of the quantum dots each coordinated with the ligand are dispersed in a solvent.

Advantageous Effects of Disclosure

Because the quantum dots include a ligand with defect compensation properties coordinated with the shell covering the core, a decrease in the luminous efficiency due to a defective portion of a quantum dot can be prevented.

BRIEF DESCRIPTION OF DRAWINGS

FIG. 1(a) is a cross-sectional view of the light-emitting device. FIG. 1(b) is a diagram for describing a quantum dot of the light-emitting device.

FIG. 4(a) is a diagram illustrating a quantum dot before a ligand is coordinated. FIG. 4(b) is a diagram for describing the configuration of the ligand. FIG. 4(c) is a diagram for describing the configuration of the quantum dot. FIG. 4(d) is a diagram for describing a coordination method for the quantum dot.

FIG. 6(a) is a plan view of the light-emitting device. FIG. 6(b) is a cross-sectional view taken along line VIb-VIb in FIG. 6(a).

FIG. 7(a) is a diagram for describing the quantum dots in a red light-emitting element. FIG. 7(b) is a diagram for describing the quantum dots in a green light-emitting element. FIG. 7(c) is a diagram for describing the quantum dots in a blue light-emitting element.

DESCRIPTION OF EMBODIMENTS

Embodiments of the disclosure will be described below in detail with reference to the drawings. The disclosure is not limited to the embodiments described below. Further, the following description will be made by giving an example in which the disclosure is applied to a light-emitting device able to be configured as a display device. In addition, in each of the drawings, the dimensions of constituent elements are not precisely illustrated as the actual dimensions of the constituent elements and the dimensional proportions of each of the constituent elements.

First Embodiment

Figure 1:
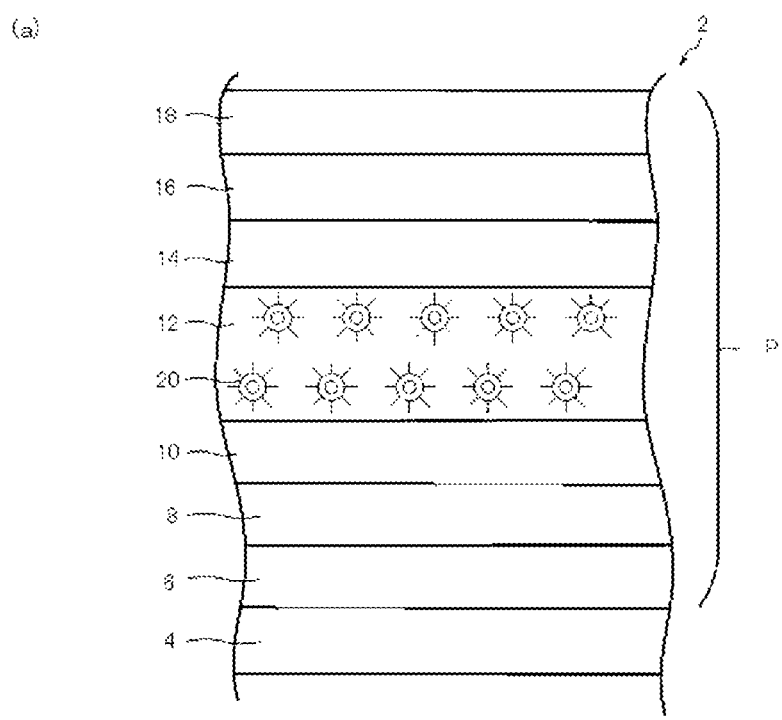
FIG. 1 is a diagram for describing a light-emitting device according to a first embodiment of the disclosure.
Figure 1:
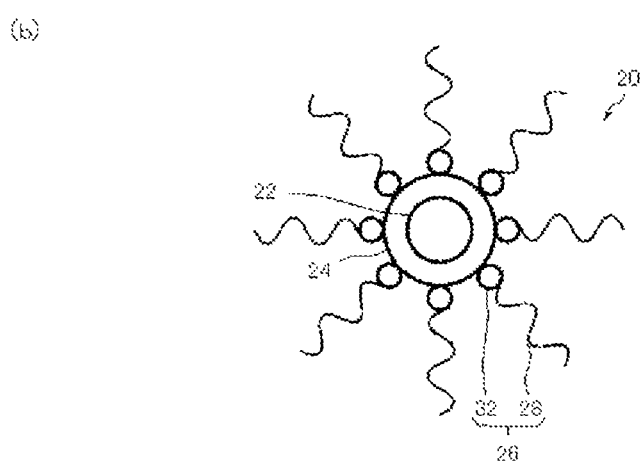

FIG. 1 is a diagram for describing a light-emitting device according to the first embodiment of the disclosure. FIG. 1(a) is a cross-sectional view of the light-emitting device. FIG. 1(b) is a diagram for describing a quantum dot of the light-emitting device. Note that hereinafter, the direction from a quantum dot layer to a first electrode of a light-emitting device is referred to as "downward," and the direction from the quantum dot layer to a second electrode of the light-emitting device is referred to as "upward".

As illustrated in FIG. 1(a), a light-emitting device 2 has a structure in which layers are layered on an array substrate 4 on which a thin film transistor (TFT), which is not illustrated, has been formed. A first electrode 6, a hole injection layer 8, a hole transport layer 10, a quantum dot layer 12, an electron transport layer 14, an electron injection layer 16, and a second electrode 18 are layered on the array substrate 4 in order from a bottom layer upward to form a light-emitting element P.

Note that, in an example different from that described above, depending on the material used for the quantum dot layer 12 functioning as a light-emitting layer, at least one layer from among the hole injection layer 8, the hole transport layer 10, the electron transport layer 14, and the electron injection layer 16 may be omitted.

The array substrate 4 is a substrate on which a TFT that drives the first electrode 6 and the second electrode 18 is formed. A material of the substrate may be glass or may be a foldable plastic. In a case in which a plastic is used for the array substrate 4, a flexible light-emitting device 2 can be obtained. The TFT may be formed on the array substrate 4 using a known method.

In the present embodiment, the first electrode 6 is an anode, and the second electrode 18 is a cathode. At least one of the first electrode 6 and the second electrode 18 is a transparent or translucent electrode, and the transparent electrode may contain a transparent oxide such as ITO, IZO, or ISO, for example. The translucent electrode may contain a metal material such as Al, Ag, or MgAg, for example. Further, either the first electrode 6 or the second electrode 18 may contain a metal material, and a preferable metal material is Al, Cu, Au, Ag, or the like having a high visible light reflectivity.

The hole injection layer 8, the hole transport layer 10, electron transport layer 14, and the electron injection layer 16 may contain materials used for layers of a known light-emitting element of the related art. The hole injection layer may contain, for example, PEDOT:PSS, MoO3, NiO, or the like. The hole transport layer may contain, for example, TPD, poly-TPD, PVK, TFB, CBP, NPD, or the like. The electron transport layer may contain, for example, ZnO nanoparticles, MgZnO nanoparticles, or the like. The electron injection layer may contain, for example, Alq3, PBD, TPBi, BCP, Balq, CDBP, Liq, or the like.

The quantum dot layer 12 has a plurality of quantum dots 20 (semiconductor nanoparticles). The quantum dots 20 may be formed by layering one to several layers in the quantum dot layer 12. The quantum dots 20 are a luminescent material that has a valence band level and a conduction band level and emits light through recombination of a hole at the valence band level with an electron at the conduction band level. Because light emitted from the quantum dots 20 has a narrower spectrum due to a quantum confinement effect, it is possible to obtain light emission with relatively deep chromaticity.

Also, in the present embodiment, each of the quantum dots 20 has a core 22, a shell 24 covering the core 22, and ligands 26 coordinated on a surface of the shell 24, as illustrated in FIG. 1(b).

The core 22 and shell 24 may contain a material for quantum dots having a known core/shell structure. In the present embodiment, the core 22 preferably contains C, Si, Ge, Sn, P, Se, Te, Cd, Zn, Mg, S, In, or O. The shell 24 contains Cd, Se, S, Zn, Te, In, P, O, Te, or Mg. Note that, although the core 22 is covered by the shell 24, the core 22 is illustrated as passing through the shell 24 in the drawing for the sake of simple illustration.

Each ligand 26 includes a long chain part 28 and a defect compensation part 32 and has defect compensation properties. In the ligand 26, when the surface of the shell 24 and the defect compensation part 32 are coordinated, the ligand 26 is coordinated with the quantum dot 20. Also, in the ligand 26, one end of the long chain part 28 is connected to the defect compensation part 32.

The defect compensation part 32 has defect compensation properties to compensate for structural defects present in the quantum dots 20 and includes, for example, a functional group containing nitrogen atoms. In particular, the defect compensation part 32 includes at least one functional group from among a primary amine, a secondary amine, aniline, pyridine, pyrrole, piperidine, and imine. Also, the defect compensation part 32 is coordinated with the surface of the shell 24 to prevent holes from the first electrode 6 and electrons from the second electrode 18 from being trapped in the structural defects, thus compensating for defects in the quantum dot 20. More specifically, the nitrogen atoms in the functional group contained in the defect compensation part 32 are basic, and the nitrogen atoms form coordinate bonds with positively charged ions, such as metal ions and protons, contained in the quantum dot 20 due to their basic nature. Further, in the coordinately bonded metal ion, the interaction with ligand 26 causes the electron level to split and reform. The phenomenon of splitting and reforming due to the interaction with the ligand 26 also occurs in the interaction between the inside of the quantum dot 20 (i.e., the core 22 and the shell 24) and the ligand 26, resulting in electron level reforming. This weakens the effect of the trap level in the quantum dot 20 and allows for defect compensation of the quantum dot 20.

Furthermore, the long chain part 28 is selected from the group consisting of $-(CH_2)_n-$, $-(CH_2-O)_m-$, $-(CH_2)_x-(CH=CH)-(CH_2)_y-$, or a combination thereof. Here, 0≤n≤17, 0≤1/2m≤16, 4≤n+1/2m≤17, 1≤x+y≤17, 1≤1/2m+x+y≤17. Further, in the long chain part 28, a terminal functional group such as —CH$_3$ is provided at the other end on the opposite side to the end connected to the defect compensation part 32, for example. Note that, in an example different from that described above, the other end of the long chain part 28 may be provided with an amine group such as —NH$_2$, for example, instead of the terminal functional group. Furthermore, instead of the terminal functional group described above, for example, a configuration may be adopted in which a functional group having a strong photooxidation preventing effect such as a hindered amine compound may be provided to impart oxidation resistance to the quantum dot 20.

In addition, in the present embodiment, the number of atoms of the long chain part 28 is from 3 to 17. In this way, in the present embodiment, sufficient defect compensation properties can be obtained while preventing the drive voltage of the light-emitting device 2 (light-emitting element P) from increasing (described in detail below). Note that "number of atoms of the long chain part 28" refers to the number of atoms contained in the main chain of the long chain part 28, and even when a secondary chain is included in the long chain part 28, the number of atoms of the secondary chain is not included.

Figure 2:
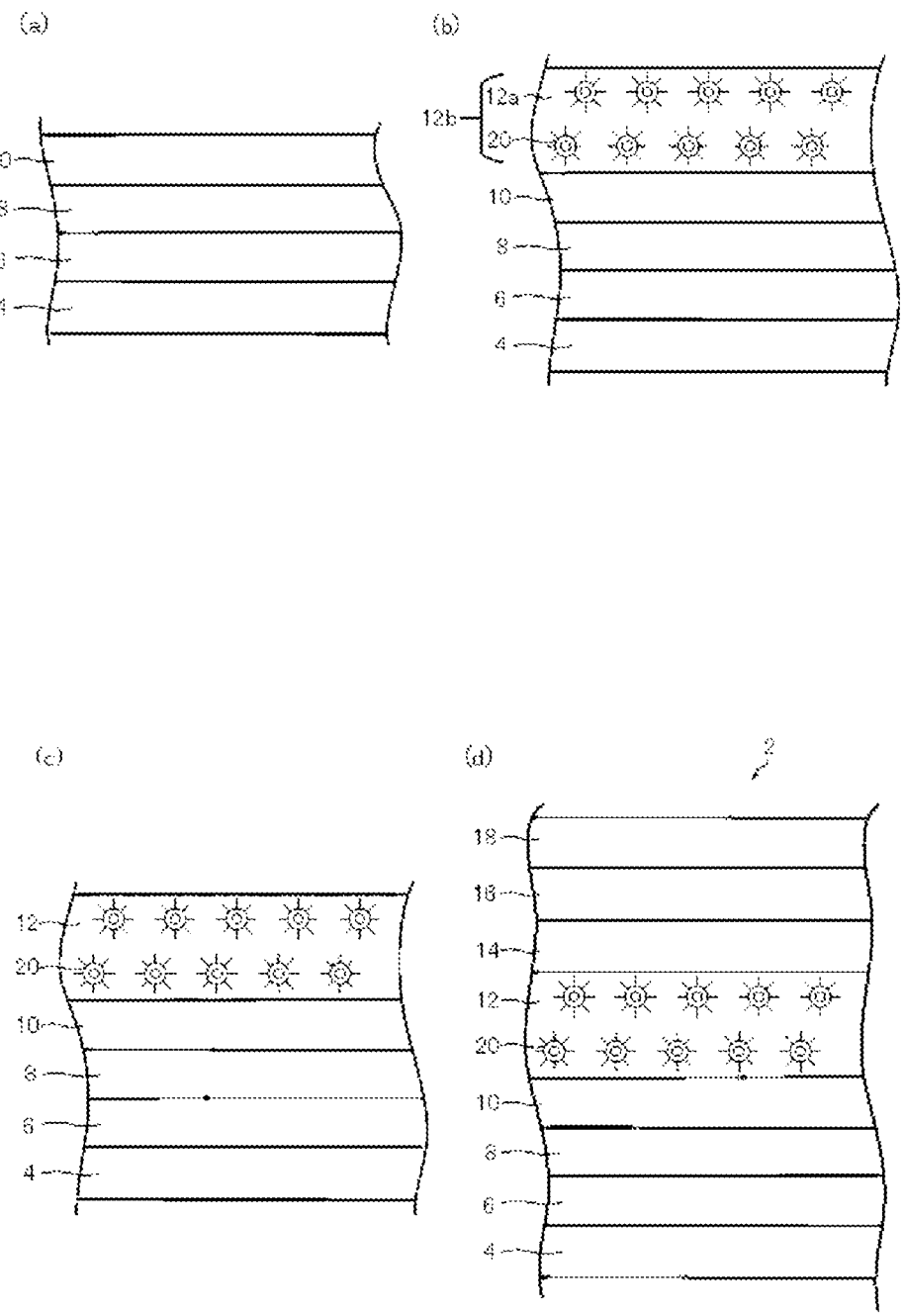
FIG. 2 is a diagram for describing an example of a method for manufacturing the light-emitting device.

Next, a method for manufacturing the light-emitting device 2 of the present embodiment will be described in detail with reference to FIG. 2. FIG. 2 is a diagram for describing an example of a method for manufacturing the light-emitting device.

In the method for manufacturing the light-emitting device 2 of the present embodiment, first, the array substrate 4 including a TFT and various wiring lines connected to the TFT is fabricated, and the first electrode 6 electrically connected to the TFT is formed on the array substrate 4 using a sputtering method or the like. Next, the hole injection layer 8 and the hole transport layer 10 are formed on the upper layer of the first electrode 6 in order from the bottom through coating formation or the like, and the layered structure illustrated in FIG. 2(*a*) is obtained. Next, the quantum dot layer 12 is formed.

Figure 3:
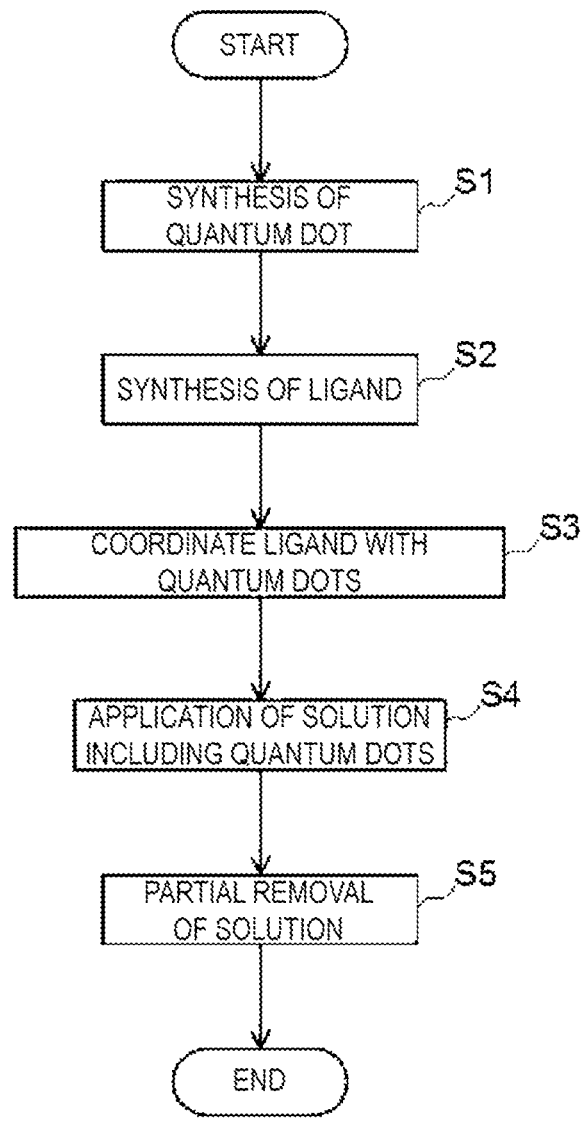
FIG. 3 is a flowchart illustrating an example of a method for forming a quantum dot layer included in the light-emitting device.
Figure 4:
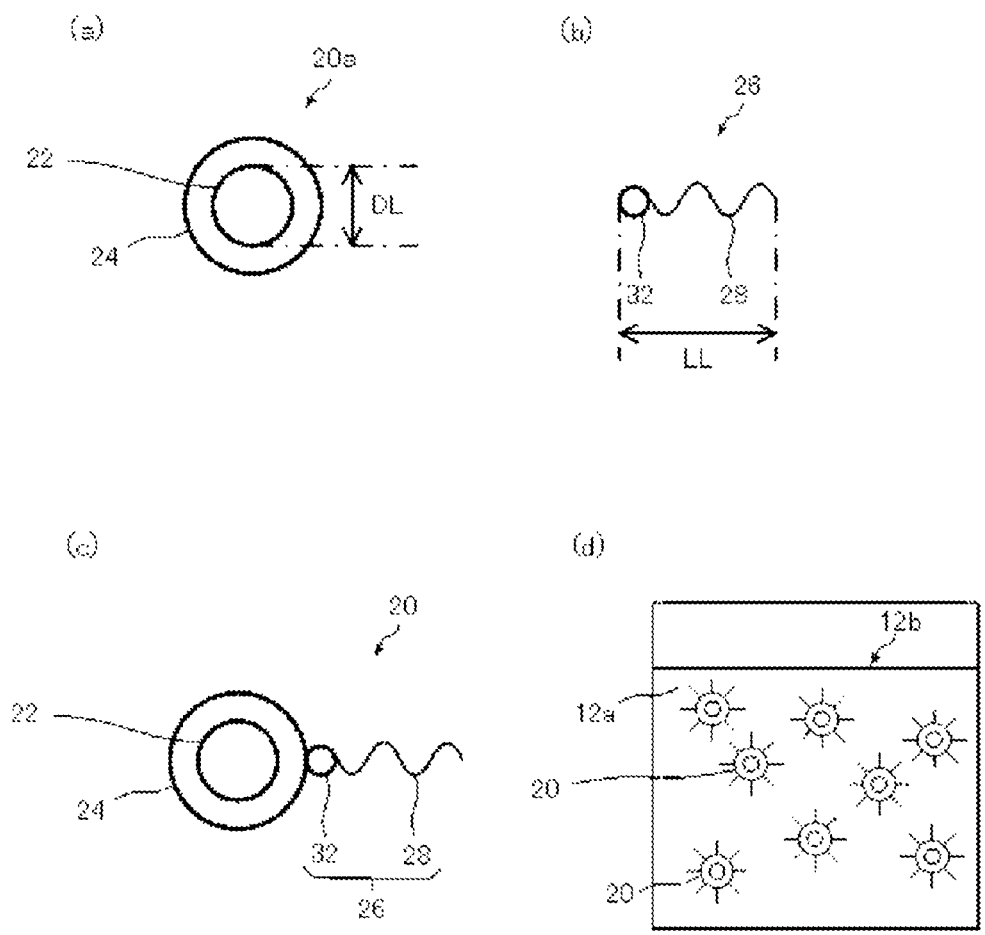
FIG. 4 is a diagram for describing the quantum dot described above and a method for forming the quantum dot.

Here, the method for forming the quantum dot layer 12 will be described in detail with reference to FIG. 3 and FIG. 4. FIG. 3 is a flowchart illustrating an example of a method for forming a quantum dot layer included in the light-emitting device. FIG. 4 is a diagram for describing the quantum dot described above and a method for forming the quantum dot. FIG. 4(*a*) is a diagram illustrating a quantum dot before a ligand is coordinated. FIG. 4(*b*) is a diagram for describing the configuration of the ligand. FIG. 4(*c*) is a diagram for describing the configuration of the quantum dot. FIG. 4(*d*) is a diagram for describing a coordination method for the quantum dot.

First, a quantum dot 20*a* prior to coordination with the ligand 26 is synthesized (step S1). In other words, a quantum dot 20*a* having a core-shell structure with the core 22 and the shell 24 covering the core 22 is synthesized as illustrated in FIG. 4(*a*). The quantum dot 20*a* may be synthesized using a known synthesis method such as a chemical synthesis method. At this time, if a diameter of the core 22 of the obtained quantum dot 20*a* is defined as DL, the diameter DL is preferably from 2 to 10 nm.

Also, aside from the synthesis of the quantum dots 20*a* described above, the synthesis of the ligand 26 illustrated in FIG. 4(*b*) is performed (step S2). That is, step S1 and step S2 described above may be performed independently of one another, or one or the other of steps S1 and S2 may be performed sequentially. Furthermore, in the synthesis of the ligand 26, the functional group of the defect compensation part 32 and the long chain part 28 may be chemically reacted, for example, and further purified by using distillation, recrystallization, a filter material, or a method using an adsorbent material, and the like as appropriate. At this time, if a length from one end to the other end of the obtained ligand 26, that is, from the end portion of the defect compensation part 32 to the end portion of the long chain part 28, is defined as a length LL of the ligand, the length LL is preferably from 0.5 to 5 nm and more preferably from 0.5 to 3 nm.

Here, the synthesis of the specific ligand 26 for each functional group of the defect compensation part 32 will be described.

For example, the ligand 26 including a primary amine or secondary amine as the defect compensation part 32 may be obtained by a nucleophilic substitution reaction, using a nucleophilic agent such as ammonia or amine, with a compound with a desired long chain part 28 structure and an electron withdrawing functional group (alkyl halide or sulfonic acid alkylester), a reduction reaction using a reducing agent such as lithium aluminum hydride on a nitro compound or a nitrile compound with a desired long chain part 28 structure, or the like.

Also, for example, the ligand 26 including the defect compensation part 32 with an annular structure (cyclic compound), such as aniline, pyridine, and pyrrole, may be obtained by an aromatic electrophilic substitution reaction such as a Friedel-Crafts reaction using an alkyl halide with a desired long chain part 28 structure or a cyclization reaction using ammonia or amine on a ketone compound with a desired long chain part 28 structure.

Also, for example, the ligand 26 including the defect compensation part 32 with a piperidine structure may be obtained by a hydrogenation reaction using Ni or the like as a catalyst on the ligand 26 with a pyridine structure synthesized by the method described above.

Also, for example, the ligand 26 including the defect compensation part 32 with an imine structure may be obtained by a dehydration condensation reaction of an aldehyde or ketone with the desired long chain part 28 structure and a primary amine.

Next, the surface of the shell 24 of the synthesized quantum dot 20*a* is coordinately bonded with the defect compensation part 32 of the ligand 26 to obtain the quantum dot 20 with which the ligand 26 is coordinated as illustrated in FIG. 4(*c*) (step S3). The above-described coordination may be performed using a method of adding a solution in which the ligand 26 is dispersed to a solution in which the quantum dots 20*a* are dispersed, or a method of mixing the above-described two solutions, performing centrifugal separation thereon, and removing the residue. Although FIG. 4(*c*) illustrates the shell 24 with one ligand 26 in coordination, more ligands 26 may be coordinated with one quantum dot 20.

As a result, a solution 12*b* in which the quantum dots 20 are dispersed in a solvent 12*a* illustrated in FIG. 4(*d*) is obtained. The solvent 12*a* may be, for example, an acyclic aliphatic solvent of hexane, octane, decane, or the like, a cyclic aliphatic solvent of cyclohexane or the like, or an aromatic solvent of toluene, or the like.

Next, as illustrated in FIG. 2(*b*), the solution 12*b* in which the quantum dots 20 are dispersed is applied to the upper surface of the hole transport layer 10 (step S4). Then, the solvent 12*a* is partially removed from the solution 12*b* (step S5). As a result, the quantum dot layer 12 illustrated in FIG. 2(c) is obtained, and the process of forming the quantum dot layer 12 is completed.

Finally, the electron transport layer 14, the electron injection layer 16, and the second electrode 18 are formed on the upper layer of the quantum dot layer 12 in order from the bottom by application formation or the like, and the layered structure illustrated in FIG. 2(d) is obtained. As a result, the light-emitting device 2 according to the present embodiment is obtained.

The light-emitting device 2 according to the present embodiment includes the quantum dots 20 with which the ligand 26 having defect compensation properties is coordinated in the quantum dot layer 12. Thus, in the light-emitting device 2 of the present embodiment, it is possible to prevent the holes and electrons from being trapped in the defective portion of the quantum dot 20 and to prevent a decrease in luminous efficiency due to the defective portion of the quantum dot 20. As a result, in the light-emitting device 2 of the present embodiment, the current and voltage for causing the light-emitting device 2 to emit light can be prevented from increasing. Furthermore, in the present embodiment, since the current and voltage for emitting light can be suppressed, low power consumption of the light-emitting device 2 can be easily achieved, and the light-emitting device 2 with excellent reliability and a long life can be easily achieved.

Figure 5:
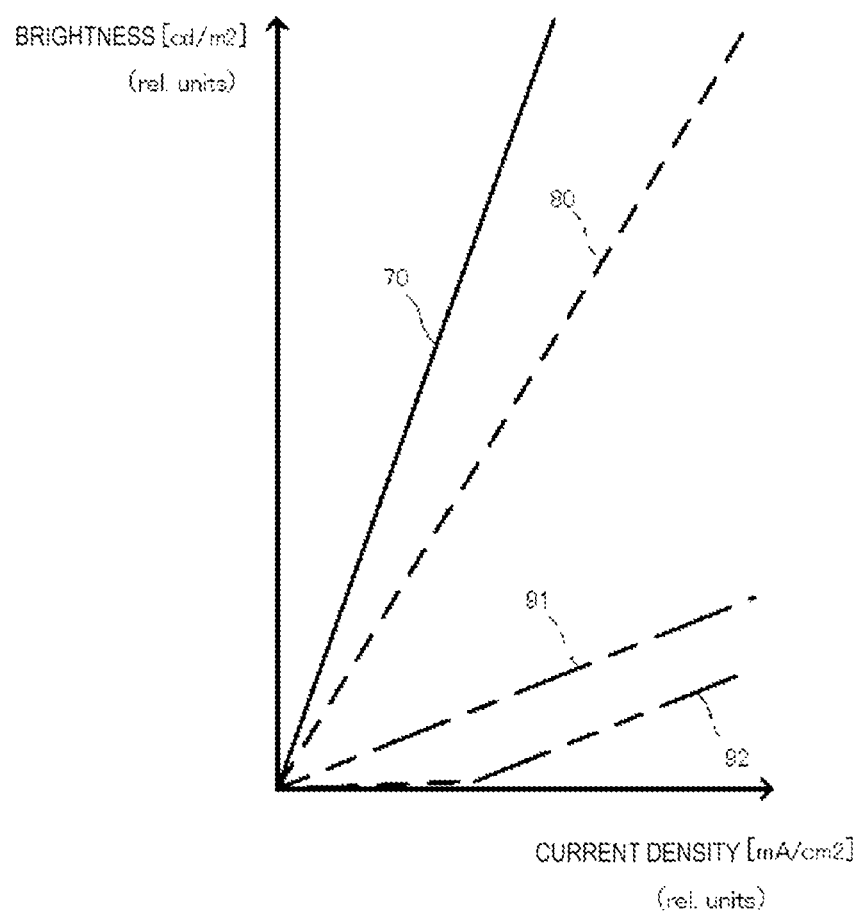
FIG. 5 is a graph for describing an example of the specific effects of the light-emitting device.

Next, the effects of the light-emitting device 2 of the present embodiment will be described in detail with reference to FIG. 5. FIG. 5 is a graph for describing an example of the specific effects of the light-emitting device.

The results (effects) of verification testing carried out by the inventors and the like of the disclosure will be described in detail below. In the verification testing, an embodiment sample 1 in which the defect compensation part 32 is configured using octylamine and the number of atoms of the long chain part 28 is 7, and an embodiment sample 2 in which the defect compensation part 32 is configured using hexadecylamine and the number of atoms of the long chain part 28 included in the ligand 26 is 15 were prepared. Furthermore, a comparison sample 1 in which the defect compensation part 32 is configured using nonanoic acid and the number of atoms of the long chain part 28 is 7, and a comparison sample 2 in which the defect compensation part 32 is configured using octanethiol and the number of atoms of the long chain part 28 included in the ligand 26 is 7 were prepared. Then, in the verification testing, light-emitting devices including each of the embodiment sample 1, the embodiment sample 2, the comparison sample 1, and the comparison sample 2 were prepared with each light-emitting device having the same configuration except for that of the ligand 26. The change in brightness when the current density of the supplied current is changed was determined.

In the embodiment sample 1 and the embodiment sample 2, it was confirmed that even if the value of the current density was slightly increased, the brightness value changed to a large value, as shown by a solid line curve 70 and a dotted line curve 80 in FIG. 5. In other words, it was demonstrated that the defect compensation part 32 of the embodiment sample 1 and the embodiment sample 2 can sufficiently compensate for the structural defect present in the quantum dot 20 and reliably prevent a decrease in luminous efficiency.

In contrast, in the comparison sample 1 and the comparison sample 2, it was confirmed that even if the value of the current density changes greatly, the brightness value shows little change, as shown by a dot-dash line curve 91 and a two-dot chain line curve 92 in FIG. 5. In other words, it was demonstrated that the defect compensation part 32 of the comparison sample 1 and the comparison sample 2 cannot compensate for the structural defect present in the quantum dot 20 and cannot prevent a decrease in luminous efficiency.

Further, in other verification testing by the inventors of the disclosure and the like, the light emission performance of the light-emitting device 2 that emits white light was tested, with the defect compensation part 32 being configured using the functional group described above (that is, at least one functional group from among primary amine, a secondary amine, aniline, pyridine, pyrrole, piperidine, and imine) and the number of atoms of the long chain part 28 included in the ligand 26 being changed. An example of the results of the verification testing is shown in Table 1. Note that, in Table 1, the light-emitting devices 2 exhibiting good light emission performance are indicated as "good" and those not exhibiting good light emission performance are indicated as "poor".

TABLE 1

| Functional group of defect compensation part; primary amine | | | | | | | |
| --- | --- | --- | --- | --- | --- | --- | --- |
| Number of atoms of long chain part 28 | 2 | 3 | 4 | ... | 16 | 17 | 18 |
| Light emission performance | Poor | Good | Good | Good | Good | Good | Poor |

As is clear from Table 1, the light-emitting devices 2 in which the number of atoms of the long chain part 28 included in the ligand 26 is from 3 to 17 were confirmed to have good light emission performance.

On the other hand, when the number of atoms in the long chain part 28 was less than 3, the defect compensation properties of the ligand 26 are not sufficient and the light emission performance was decreased. That is, in the case where the number of atoms of the long chain part 28 is low, aggregation between the quantum dots 20 is likely to occur when forming the quantum dot layer 12, and the ligand 26 cannot be sufficiently coordinated on the surface of the quantum dot 20 (the surface of the shell 24). In addition, in the case where the number of atoms of the long chain part 28 exceeds 17, the value of the drive voltage of the light-emitting device 2 increases too much and the light emission performance was decreased.

Second Embodiment

Figure 6:
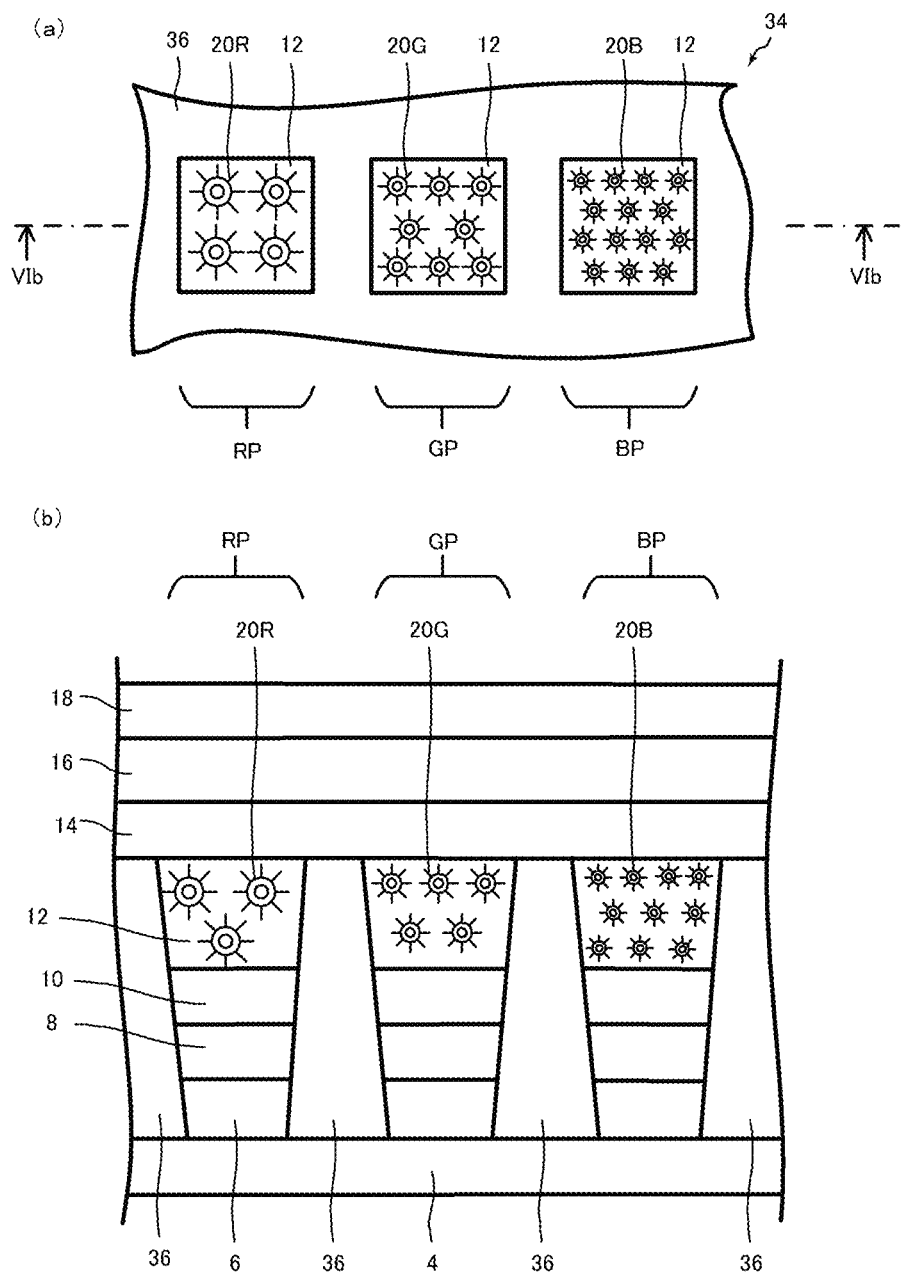
FIG. 6 is a diagram for describing a light-emitting device according to a second embodiment of the disclosure.

FIG. 6 is a diagram for describing a light-emitting device according to the second embodiment of the disclosure. FIG. 6(a) is a plan view of the light-emitting device. FIG. 6(b) is a cross-sectional view taken along line VIb-VIb in FIG. 6(a).

As illustrated in the drawings, the differences between the present embodiment and the first embodiment are that a red light-emitting element emitting red light, a green light-emitting element emitting green light, and a blue light-emitting element emitting blue light are provided instead of a white light-emitting element emitting white light. Note that elements common to those in the first embodiment are denoted by the same reference signs, and overlapping description thereof will be omitted.

Also, as illustrated in FIG. 6, a light-emitting device 34 according to the present embodiment may further include an edge cover 36 in comparison to the light-emitting device 2 of the first embodiment, and may have the same configuration except that each layer from the first electrode 6 to the quantum dot layer 12 is divided into a plurality of light-emitting elements. That is, each layer from the first electrode 6 to the quantum dot layer 12 is formed for each of the plurality of divided light-emitting elements. Note that, in the present embodiment, the electron transport layer 14, the electron injection layer 16, and the second electrode 18 are formed to be shared by the plurality of divided light-emitting elements.

Specifically, in the light-emitting device 34 of the present embodiment, each layer from the first electrode 6 to the quantum dot layer 12 is divided into a red light-emitting element RP, a green light-emitting element GP, and a blue light-emitting element BP, as illustrated in FIG. 6. The quantum dot layer 12 in the red light-emitting element RP includes, as quantum dots, red quantum dots 20R that emit red light during light emission. Furthermore, the quantum dot layers 12 in the green light-emitting element GP and the blue light-emitting element BP include, as quantum dots, green quantum dots 20G and blue quantum dots 20B that emit green light and blue light during light emission, respectively.

Here, the blue light is light having the central wavelength of the light emission in a wavelength band from 400 nm to 500 nm. The green light is light having the central wavelength of the light emission in a wavelength band longer than 500 nm and shorter than or equal to 600 nm. The red light is light having the central wavelength of the light emission in a wavelength band longer than 600 nm and shorter than or equal to 780 nm.

Figure 7:
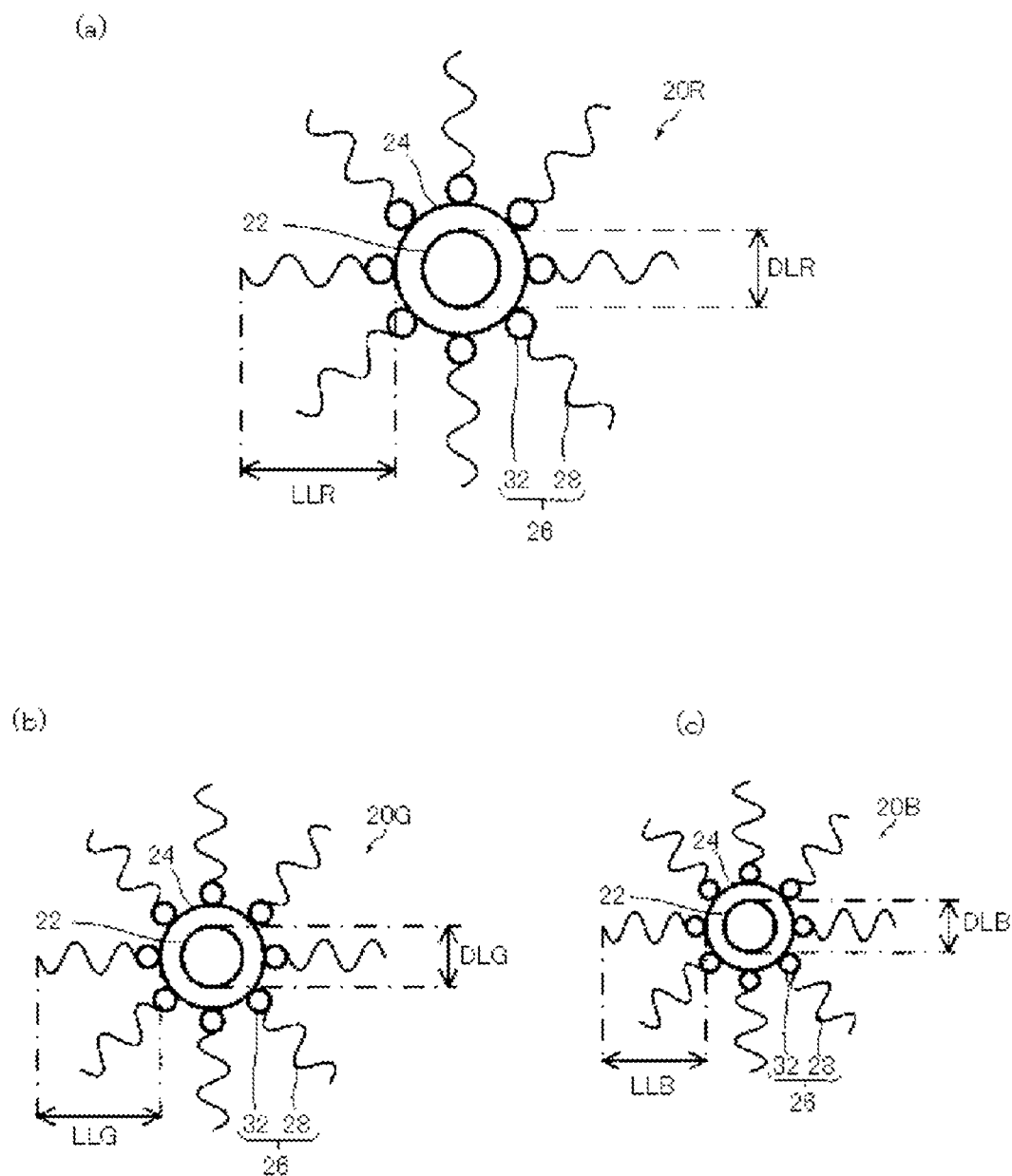
FIG. 7 is a diagram for describing quantum dots included in the light-emitting device illustrated in FIG. 6.

Next, the red quantum dots 20R, the green quantum dots 20G, and the blue quantum dots 20B will be described in detail below with reference to FIG. 7. FIG. 7 is a diagram for describing the quantum dots included in the light-emitting device illustrated in FIG. 6. FIG. 7(a) is a diagram for describing the quantum dots in the red light-emitting element. FIG. 7(b) is a diagram for describing the quantum dots in the green light-emitting element. FIG. 7(c) is a diagram for describing the quantum dots in the blue light-emitting element.

As illustrated in FIGS. 7(a) to 7(c), each of the red quantum dot 20R, the green quantum dot 20G, and the blue quantum dot 20B includes a core 22, a shell 24 covering the core 22, and a ligand 26 coordinated with a surface of the shell 24, similar to the quantum dot 20 in the first embodiment.

A wavelength of light emitted by the quantum dots is generally proportional to a size of a core diameter of the quantum dots. Therefore, the red quantum dot 20R, the green quantum dot 20G, and the blue quantum dot 20B have different sizes. For example, a diameter of the core 22 of the green quantum dot 20G is less than a diameter of the core 22 of the red quantum dot 20R and greater than a diameter of the core 22 of the blue quantum dot 20B. Accordingly, in the present embodiment, a length of the ligand 26 of the green quantum dot 20G is less than a length of the ligand 26 of the red quantum dot 20R and greater than a length of the ligand 26 of the blue quantum dot 20B.

Also, as illustrated in FIGS. 7(a) to 7(c), for each of the red quantum dot 20R, the green quantum dot 20G, and the blue quantum dot 20B, diameters of the cores 22 of the quantum dots are defined as a diameter DLR, a diameter DLG, and a diameter DLB. In this case, the diameter DLR>the diameter DLG>the diameter DLB may be satisfied. In addition, as illustrated in FIGS. 7(a) to 7(c), for each of the red quantum dot 20R, the green quantum dot 20G, and the blue quantum dot 20B, lengths of the ligands 26 are defined as a length LLR, a length LLG, and a length LLB, and in this case, the length LLR>the length LLG>the length LLB may be satisfied. Note that for the red quantum dots 20R, the green quantum dots 20G, and the blue quantum dots 20B, the defect compensation part 32 may be configured to have the same functional group, or can each be configured with different functional groups.

If the diameter of each quantum dot and the length of each ligand in the present embodiment have the dimensions described above, it is possible to design quantum dots that emit light with respective wavelengths more efficiently. Furthermore, in the red quantum dots 20R, the green quantum dots 20G, and the blue quantum dots 20B, as described in detail below, the number of atoms of the long chain part 28 included in the ligand 26 is appropriately defined for each, and the corresponding red light-emitting element RP, green light-emitting element GP, and blue light-emitting element BP are configured to have good light emission performance.

Each of the red quantum dot 20R, the green quantum dot 20G, and the blue quantum dot 20B may be manufactured using the same manufacturing method as the quantum dot 20 in the first embodiment. Here, a length of the ligand 26 of each quantum dot can be designed by varying a length of the long chain part 28.

In the method for manufacturing the light-emitting device 34 according to the present embodiment, edge covers 36 are first formed on the array substrate 4. Next, for each of regions divided by the edge covers 36, the first electrode 6, the hole injection layer 8, the hole transport layer 10, and the quantum dot layer 12 are formed. At this time, the quantum dot layer 12 is formed from a solution in which the red quantum dots 20R, the green quantum dots 20G, and the blue quantum dots 20B are dispersed in the red light-emitting element RP, the green light-emitting element GP, and the blue light-emitting element BP, respectively.

In the formation of the quantum dot layer 12, for example, the solution 12b in which the red quantum dots 20R are dispersed is applied to the upper layer of the hole transport layer 10 in the red light-emitting element RP, and the solvent 12a in the red light-emitting element RP is partially removed. As a result, the quantum dot layer 12 in the red light-emitting element RP is formed. A similar step is performed for the green light-emitting element GP and the blue light-emitting element BP to form a quantum dot layer 12 in the green light-emitting element GP and the blue light-emitting element BP, respectively.

Note that the hole injection layer 8 and the hole transport layer 10 may contain different materials in each light-emitting element, and may be formed by selecting an appropriate material for each material of the quantum dots 20 in each light-emitting element.

Finally, as in the first embodiment, the electron transport layer 14, the electron injection layer 16, and the second electrode 18 are formed on the upper layer of the quantum dot layer 12 and the edge covers 36 in order from the bottom through application formation or the like. As a result, the light-emitting device 34 illustrated in FIG. 6 is obtained.

The light-emitting device 34 according to the present embodiment includes the quantum dot layer 12 including the red quantum dots 20R emitting red light, the green quantum dots 20G emitting green light, and the blue quantum dots 20B emitting blue light corresponding to each of the light-emitting elements. Thus, the light-emitting device 34 according to the present embodiment is different from that of the first embodiment in that it can display multiple colors without a color filter. Also, in the red quantum dot 20R, the green quantum dot 20G, and the blue quantum dot 20B, the ligand 26 having an appropriate length can be coordinated.

Thus, compensating for defects in the corresponding quantum dot can be performed more efficiently.

Here, the results of verification testing carried out by the inventors and the like of the disclosure will be described in detail below. In the verification testing, for light-emitting devices 34 including a red light-emitting element RP, a green light-emitting element GP, and a blue light-emitting element BP, the light emission performance was tested, with the different color defect compensation parts 32 being configured using the functional group described above (that is, at least one functional group from among primary amine, a secondary amine, aniline, pyridine, pyrrole, piperidine, and imine) and the number of atoms of the long chain part 28 included in the ligand 26 being changed. An example of the results of the verification testing is shown in Table 2, Table 3, and Table 4. Note that, in Table 2 to Table 4, the light-emitting devices 2 exhibiting good light emission performance are indicated as "good" and those not exhibiting good light emission performance are indicated as "poor".

TABLE 2

Red light-emitting element RP
Functional group of defect compensation part; primary amine

| Number of atoms of long chain part 28 | 2 | 3 | 4 | ... | 16 | 17 | 18 |
|---|---|---|---|---|---|---|---|
| Light emission performance | Poor | Good | Good | Good | Good | Good | Poor |

TABLE 3

Green light-emitting element GP
Functional group of defect compensation part; primary amine

| Number of atoms of long chain part 28 | 2 | 3 | 4 | ... | 13 | 14 | 15 |
|---|---|---|---|---|---|---|---|
| Light emission performance | Poor | Good | Good | Good | Good | Good | Poor |

TABLE 4

Blue light-emitting element BP
Functional group of defect compensation part; primary amine

| Number of atoms of long chain part 28 | 2 | 3 | 4 | ... | 10 | 11 | 12 |
|---|---|---|---|---|---|---|---|
| Light emission performance | Poor | Good | Good | Good | Good | Good | Poor |

As is clear from Table 2, the red light-emitting elements RP in which the number of atoms of the long chain part 28 is from 3 to 17 were confirmed to have good light emission performance.

On the other hand, in the red light-emitting elements RP in which the number of atoms in the long chain part 28 is less than 3, the defect compensation properties of the ligand 26 are not sufficient and the light emission performance is decreased. That is, in the case where the number of atoms of the long chain part 28 is low, aggregation between the red quantum dots 20R is likely to occur when forming the quantum dot layer 12, and the ligand 26 cannot be sufficiently coordinated on the surface of the red quantum dot 20R (the surface of the shell 24). In addition, in the case where the number of atoms of the long chain part 28 exceeds 17, the value of the drive voltage of the red light-emitting element RP increases too much and the light emission performance is decreased.

Also, as is clear from Table 3, the green light-emitting elements GP in which the number of atoms of the long chain part 28 included in the ligand 26 is from 3 to 14 were confirmed to have good light emission performance.

On the other hand, in the green light-emitting elements GP in which the number of atoms in the long chain part 28 is less than 3, the defect compensation properties of the ligand 26 are not sufficient and the light emission performance is decreased. That is, in the case where the number of atoms of the long chain part 28 is low, aggregation between the green quantum dots 20G is likely to occur when forming the quantum dot layer 12, and the ligand 26 cannot be sufficiently coordinated on the surface of the green quantum dot 20G (the surface of the shell 24). In addition, in the case where the number of atoms of the long chain part 28 exceeds 14, the value of the drive voltage of the green light-emitting element GP increases too much and the light emission performance is decreased.

Also, as is clear from Table 4, the blue light-emitting elements BP in which the number of atoms of the long chain part 28 included in the ligand 26 is from 3 to 11 were confirmed to have good light emission performance.

On the other hand, in the blue light-emitting elements BP in which the number of atoms in the long chain part 28 is less than 3, the defect compensation properties of the ligand 26 are not sufficient and the light emission performance is decreased. That is, in the case where the number of atoms of the long chain part 28 is low, aggregation between the blue quantum dots 20B is likely to occur when forming the quantum dot layer 12, and the ligand 26 cannot be sufficiently coordinated on the surface of the blue quantum dot 20B (the surface of the shell 24). In addition, in the case where the number of atoms of the long chain part 28 exceeds 11, the value of the drive voltage of the blue light-emitting element BP increases too much and the light emission performance is decreased.

Furthermore, as in the first embodiment, the inventor and the like of the disclosure also prepared, in the present embodiment, the comparison sample 1 and the comparison sample 2 described above as well as a present embodiment sample with the respective colors red, green, and blue to perform verification testing in which the relationship between the current density and the brightness was tested. The results of the verification testing were substantially similar to those shown in FIG. 5. In other words, in the present embodiment samples with the red light, green light, and blue light, it was confirmed that even if the value of the current density was slightly increased, the brightness value changed to a large value. Specifically, since the relationship between current density and the brightness varies depending on the emission wavelength of the colors, namely, red, green, and blue, the values for the brightness (vertical axis) are different for each of the colors described above from that shown in FIG. 5. However, the relative values are generally shown by the curve 70 and the curve 80 in FIG. 5. On the other hand, in the comparison sample 1 and the comparison sample 2 with the red light, green light, and blue light, it was confirmed that even if the value of the current density changes greatly, the brightness value shows little change.

Also, in the present embodiment, the number of atoms of the long chain part 28 included in the ligand 26 coordinated with the green quantum dot 20G is less than the number of atoms of the long chain part 28 included in the ligand 26 coordinated with the red quantum dot 20R and greater than the number of atoms of the long chain part 28 included in the ligand 26 coordinated with the blue quantum dot 20B. In this way, in the present embodiment, in the red quantum dot 20R, the green quantum dot 20G, and the blue quantum dot 20B, defects can be compensated for and the light of each wavelength can be emitted more efficiently.

Figure 8:
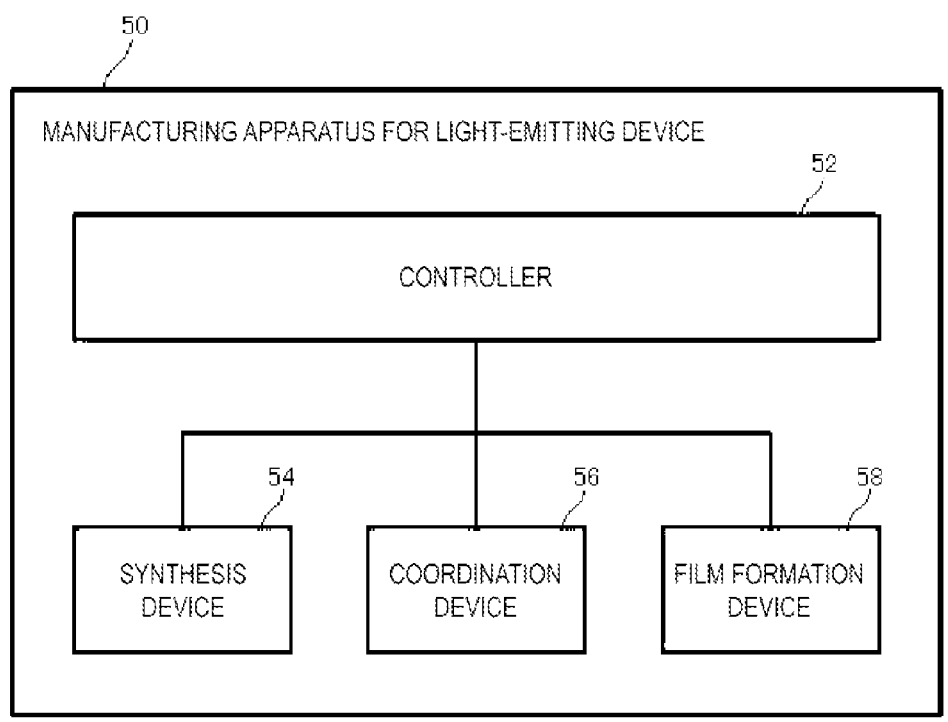
FIG. 8 is a block diagram illustrating a manufacturing apparatus for the light-emitting device according to the first or second embodiment.

Next, a manufacturing apparatus for a light-emitting device used in the first and second embodiments will be described in detail with reference to FIG. 8. FIG. 8 is a block diagram illustrating a manufacturing apparatus for the light-emitting device according to the first or second embodiment.

As illustrated in FIG. 8, a manufacturing apparatus 50 for a light-emitting device includes a controller 52, a synthesis device 54, a coordination device 56, and a film formation device 58. The controller 52 controls the synthesis device 54, the coordination device 56, and the film formation device 58. The synthesis device 54 synthesizes core-shell-structured quantum dots 20a and ligands 26 according to the embodiments described above. The coordination device 56 coordinates the core-shell-structured quantum dots 20a with the ligands 26 according to the embodiments described above. The film formation device 58 forms each layer of the light-emitting device according to the embodiments described above, including the quantum dot layer 12.

INDUSTRIAL APPLICABILITY

The disclosure can be applied to a light-emitting device including quantum dots.

The invention claimed is:
1. A light-emitting device comprising:
a light-emitting element comprising a first electrode, a second electrode, and a quantum dot layer between the first electrode and the second electrode,
wherein, in the quantum dot layer, a plurality of quantum dots is layered,
each of the plurality of quantum dots comprises a core, a shell covering the core, and a ligand coordinated with a surface of the shell and having defect compensation properties,
the light-emitting element comprises a red light-emitting element comprising a red quantum dot configured to emit red light in the quantum dot layer, a green light-emitting element comprising a green quantum dot configured to emit green light in the quantum dot layer, and a blue light-emitting element comprising a blue quantum dot configured to emit blue light in the quantum dot layer, and
a length of the ligand coordinated with the green quantum dot is less than a length of the ligand coordinated with the red quantum dot and greater than a length of the ligand coordinated with the blue quantum dot.
2. The light-emitting device according to claim 1,
wherein the ligand comprises a defect compensation part coordinated with the surface of the shell and a long chain part connected at one end to the defect compensation part, and
the defect compensation part comprises at least one of a primary amine, a secondary amine, an aniline, a pyridine, a pyrrole, a piperidine, or an imine.
3. The light-emitting device according to claim 1, further comprising:
a plurality of light-emitting elements, including the light-emitting element,
wherein the first electrode and the quantum dot layer are provided for each of the plurality of light-emitting elements, and
the second electrode is shared by the plurality of light-emitting elements.

4. The light-emitting device according to claim 1,
wherein the ligand coordinated with the plurality of quantum dots includes a long chain part, and,
a number of atoms of the long chain part is from 3 to 17.
5. The light-emitting device according to claim 1,
wherein a number of atoms of a long chain part included in the ligand coordinated with the green quantum dot is less than a number of atoms of a long chain part included in the ligand coordinated with the red quantum dot and greater than a number of atoms of a long chain part included in the ligand coordinated with the blue quantum dot.
6. The light-emitting device according to claim 1,
wherein in the ligand coordinated with the red quantum dot, a number of atoms of a long chain part included in the ligand is from 3 to 17.
7. The light-emitting device according to claim 1,
wherein in the ligand coordinated with the green quantum dot, a number of atoms of a long chain part included in the ligand is from 3 to 14.
8. The light-emitting device according to claim 1,
wherein in the ligand coordinated with the blue quantum dot, a number of atoms of a long chain part included in the ligand is from 3 to 11.
9. The light-emitting device according to claim 1,
wherein a defect compensation part in each of the red light-emitting element, the green light-emitting element, and the blue light-emitting element comprises a primary amine, and
a number of atoms of a long chain part in each of the red light-emitting element, the green light-emitting element, and the blue light-emitting element is 7.
10. The light-emitting device according to claim 1,
wherein a defect compensation part in at least one of the red light-emitting element, the green light-emitting element, and the blue light-emitting element comprises a primary amine, and
a number of atoms of a long chain part in at least one of the red light-emitting element, the green light-emitting element, and the blue light-emitting element is 7.
11. A light-emitting device comprising:
a light-emitting element comprising a first electrode, a second electrode, and a quantum dot layer between the first electrode and the second electrode,
wherein, in the quantum dot layer, a plurality of quantum dots is layered,
each of the plurality of quantum dots comprises a core, a shell covering the core, and a ligand coordinated with a surface of the shell and having defect compensation properties,
the light-emitting element comprises a red light-emitting element comprising a red quantum dot configured to emit red light in the quantum dot layer, a green light-emitting element comprising a green quantum dot configured to emit green light in the quantum dot layer, and a blue light-emitting element comprising a blue quantum dot configured to emit blue light in the quantum dot layer, and
a number of atoms of a long chain part included in the ligand coordinated with the green quantum dot is less than a number of atoms of a long chain part included in the ligand coordinated with the red quantum dot and greater than a number of atoms of a long chain part included in the ligand coordinated with the blue quantum dot.

12. The light-emitting device according to claim 11,
wherein the ligand comprises a defect compensation part coordinated with the surface of the shell and the long chain part connected at one end to the defect compensation part, and the defect compensation part comprises at least one of a primary amine, a secondary amine, an aniline, a pyridine, a pyrrole, a piperidine, or an imine.

13. The light-emitting device according to claim 11, further comprising:
a plurality of light-emitting elements, including the light-emitting element,
wherein the first electrode and the quantum dot layer are provided for each of the plurality of light-emitting elements, and
the second electrode is shared by the plurality of light-emitting elements.

14. The light-emitting device according to claim 11,
wherein the ligand coordinated with the plurality of quantum dots includes the long chain part, and,
a number of atoms of the long chain part is from 3 to 17.

15. The light-emitting device according to claim 11,
wherein in the ligand coordinated with the red quantum dot, the number of atoms of the long chain part included in the ligand is from 3 to 17.

16. The light-emitting device according to claim 11,
wherein in the ligand coordinated with the green quantum dot, the number of atoms of the long chain part included in the ligand is from 3 to 14.

17. The light-emitting device according to claim 11,
wherein in the ligand coordinated with the blue quantum dot, the number of atoms of the long chain part included in the ligand is from 3 to 11.

18. The light-emitting device according to claim 11,
wherein a defect compensation part in each of the red light-emitting element, the green light-emitting element, and the blue light-emitting element comprises the primary amine, and
the number of atoms of the long chain part in each of the red light-emitting element, the green light-emitting element, and the blue light-emitting element is 7.

19. The light-emitting device according to claim 11,
wherein a defect compensation part in at least one of the red light-emitting element, the green light-emitting element, and the blue light-emitting element comprises the primary amine, and
the number of atoms of the long chain part in the at least one of the red light-emitting element, the green light-emitting element, and the blue light-emitting element is 7.

* * * * *